United States Patent
Lo et al.

(10) Patent No.: US 8,143,527 B2
(45) Date of Patent: Mar. 27, 2012

(54) GOLDEN FINGER FOR FLEXIBLE PRINTED CIRCUITBOARD

(75) Inventors: Chin-Wen Lo, Taichung (TW);
Hsueh-Chih Wu, Taichung (TW)

(73) Assignee: Wintek Corporation, Taichung (TW)

( * ) Notice: Subject to any disclaimer, the term of this patent is extended or adjusted under 35 U.S.C. 154(b) by 334 days.

(21) Appl. No.: 12/575,863

(22) Filed: Oct. 8, 2009

(65) Prior Publication Data

US 2010/0096165 A1     Apr. 22, 2010

(30) Foreign Application Priority Data

Oct. 17, 2008  (TW) ............................... 97218535 U

(51) Int. Cl.
*H05K 1/00* (2006.01)

(52) U.S. Cl. ........ 174/254; 174/261; 174/262; 361/749; 361/750; 361/751

(58) Field of Classification Search ................... 439/67, 439/59, 55, 77–78; 361/737, 749–751; 174/254, 174/261, 262
See application file for complete search history.

(56) References Cited

U.S. PATENT DOCUMENTS

| | | | |
|---|---|---|---|
| 6,430,059 B1 * | 8/2002 | Hung et al. | 361/793 |
| 6,910,637 B2 * | 6/2005 | Hsieh et al. | 235/492 |
| 7,484,967 B2 * | 2/2009 | Ichino et al. | 439/67 |
| 7,544,897 B2 * | 6/2009 | Kobayashi | 174/254 |
| 7,688,594 B2 * | 3/2010 | Muto et al. | 361/749 |
| 7,731,506 B2 * | 6/2010 | Lo et al. | 439/67 |
| 2005/0241954 A1 * | 11/2005 | Iwanami | 205/182 |

* cited by examiner

*Primary Examiner* — Angel R Estrada
*Assistant Examiner* — Dimary Lopez
(74) *Attorney, Agent, or Firm* — Morris Manning & Martin LLP; Tim Tingkang Xia, Esq.

(57) ABSTRACT

A golden finger for flexible printed circuitboard, comprises: a frame with a tail, being composed of a stiffening plate, a bottom substrate, a bottom copper layer, a cover layer, and a top copper layer while enabling the bottom copper layer to be formed with at least one first routing and at least one second routing, and enabling the top copper layer to be formed with at least one first pin and at least one second pin; at least one first via hole, each being filled with a conductive material and disposed at a position between its corresponding first pin and first routing for connecting the first pin to the first routing electrically; and at least one second via hole, each filled with a conductive material and being disposed at a position between the its corresponding second pin and second routing for connecting the second pin to the second routing electrically.

14 Claims, 4 Drawing Sheets

US 8,143,527 B2

GOLDEN FINGER FOR FLEXIBLE PRINTED CIRCUITBOARD

FIELD OF THE INVENTION

The present invention relates to a golden finger for flexible printed circuitboard (FPC), and more particularly, to a layout design for golden finger capable of enabling the golden finger to be manufactured with larger allowable manufacturing tolerance as the pins and routings of the golden finger are disposed on different layers of the same with comparatively larger width, and thus capable of being manufactured with lower cost and higher yield while preventing the broken circuit in the golden finger from happening.

BACKGROUND OF THE INVENTION

Please refer to FIG. 1 and FIG. 2, which show a conventional pin layout of a golden finger for flexible printed circuitboard. From bottom up that the frame 10 of the golden finger is configured with a stiffening plate 11, a bottom substrate 12, a bottom copper layer 13, a top substrate 14, a top copper layer 15, and a cover layer 16 in a stacking manner. As shown in FIG. 1, there are two sets of pins 15a, 15b formed on the top copper layer 15 in a manner that the pins 15a, 15b in the two sets are connected respectively to their corresponding routings 151a, 151b while arranging the pins 15a along with their connecting routings 151a to be arranged alternating with the pins 15b along with their connecting routings 151b. Please refer to FIG. 3 and FIG. 4, which show a conventional pin layout of a golden finger for flexible printed circuitboard. Similarly, from bottom up that the frame 20 of the golden finger is configured with a stiffening plate 21, a bottom substrate 22, a bottom copper layer 23, a top substrate 24, a top copper layer 25, and a cover layer 26 in a stacking manner. As shown in FIG. 3, there are two sets of pins 25a, 25b formed on the top copper layer 25 in a manner that the pins 25a, 25b in the two sets are connected respectively to their corresponding routings 251a, 251b while arranging the pins 25a along with their connecting routings 251a to be arranged alternating with the pins 25b along with their connecting routings 251b. In the layout shown in FIG. 1 and FIG. 2, as the pins 15a, 15b along with their routings 151a, 151b are all being formed on the top copper layer 15, there are strict restrictions regarding to the line widths of the pins 15a, 15b and their routings 151a, 151b as well as the intervals therebetween for the purpose of arranging sufficient amount of pins and routings on the same copper layer according to actual requirement. However, as the amount of pins required to be arranged in a golden finger is increasing with the miniaturization trend of modern electric products, such golden finger must be manufactured with high accuracy especially for its pin layout. However, the cost for some manufacturers to maintain such high manufacturing accuracy is low production yield. On the other hand, the trade off for other manufacturers capable of maintaining such manufacturing accuracy is that the manufacturing cost of FPC with such golden fingers is increased. In addition, the alternating routings 151a, 151b formed on a same layer of a golden finger may be damaged or even broken while being bended by an external force as they are most likely very thin.

SUMMARY OF THE INVENTION

In view of the disadvantages of prior art, the primary object of the present invention is to provide a golden finger for flexible printed circuitboard (FPC), capable of enabling the golden finger to be manufactured with larger allowable manufacturing tolerance as the pins and routings of the golden finger are disposed on different layers of the same with comparatively larger line width, and thus capable of being manufactured with lower cost and higher yield while preventing the broken circuit in the golden finger from happening.

To achieve the above object, the present invention provides a golden finger for flexible printed circuitboard (FPC), comprising: a frame with a tail, being composed of a stiffening plate, a bottom substrate, a bottom copper layer, a cover layer, and a top copper layer by arranging those from bottom to top in a stacking manner; at least one first routing, formed on the bottom copper layer; at least one second routing, formed on the bottom copper layer; at least one first pin, formed on the top copper layer; at least one second pin, formed on the top copper layer; at least one first via hole, each being disposed at a position between the its corresponding first pin and first routing while having a conductive material disposed therein for enabling the first pin to connected with the first routing electrically; and at least one second via hole, each being disposed at a position between the its corresponding second pin and second routing while having a conductive material disposed therein for enabling the second pin to connected with the second routing electrically.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
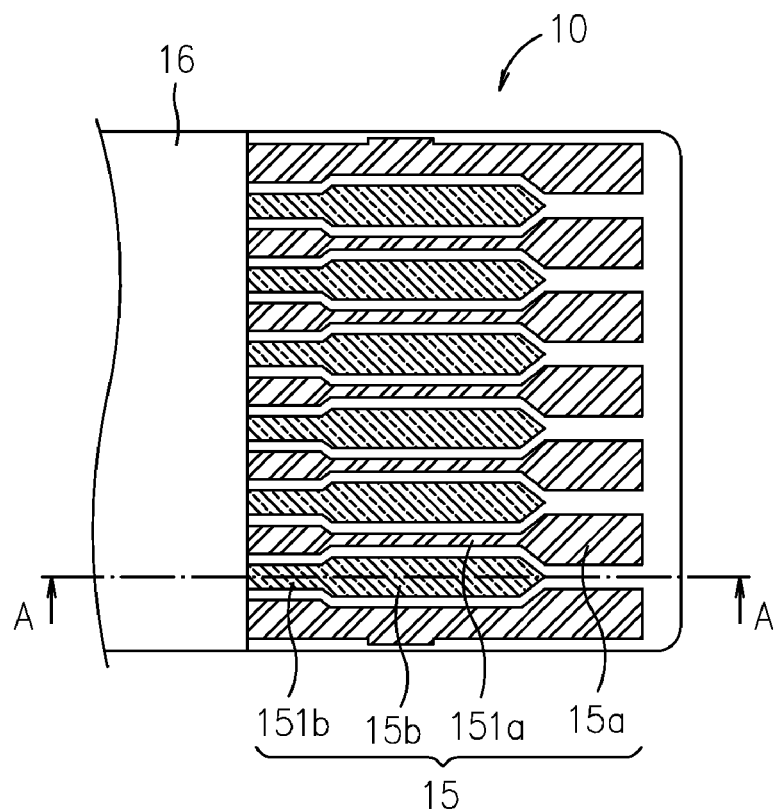
FIG. 1 shows a conventional pin layout of a golden finger for flexible printed circuitboard.
Figure 2:
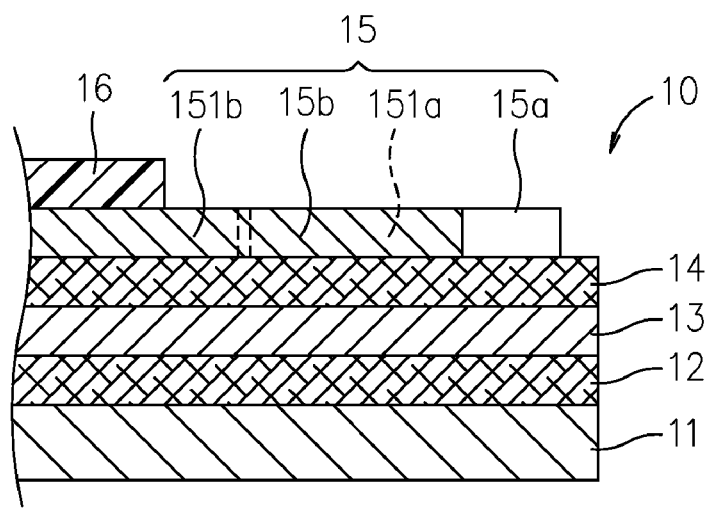
FIG. 2 is an A-A cross sectional view of FIG. 1.
Figure 3:
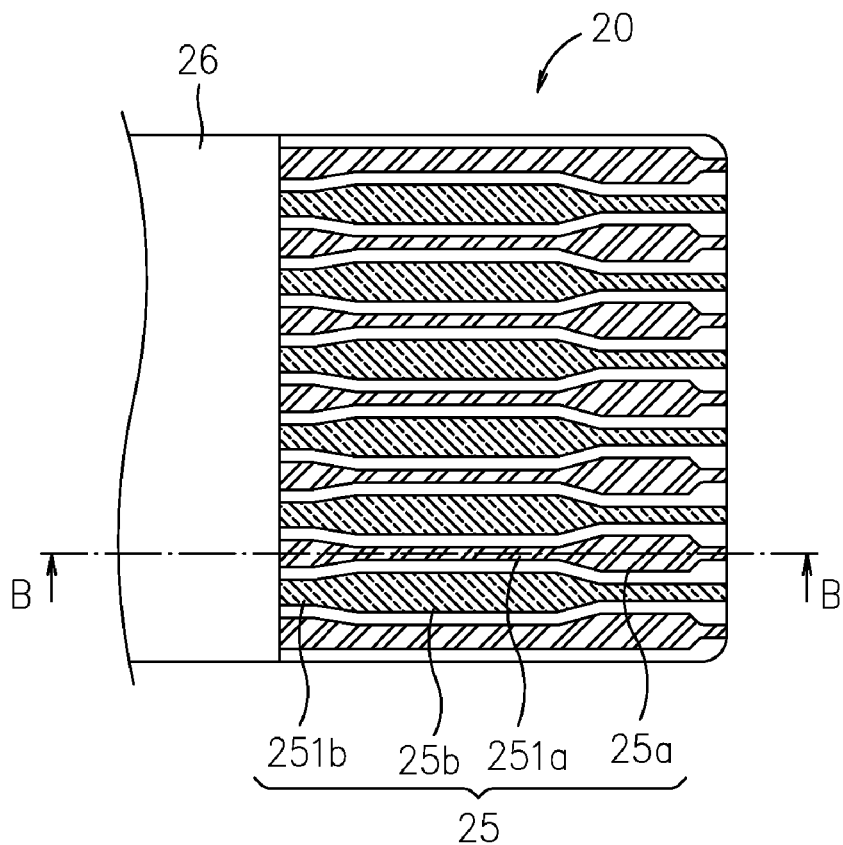
FIG. 3 shows another conventional pin layout of a golden finger for flexible printed circuitboard.
Figure 4:
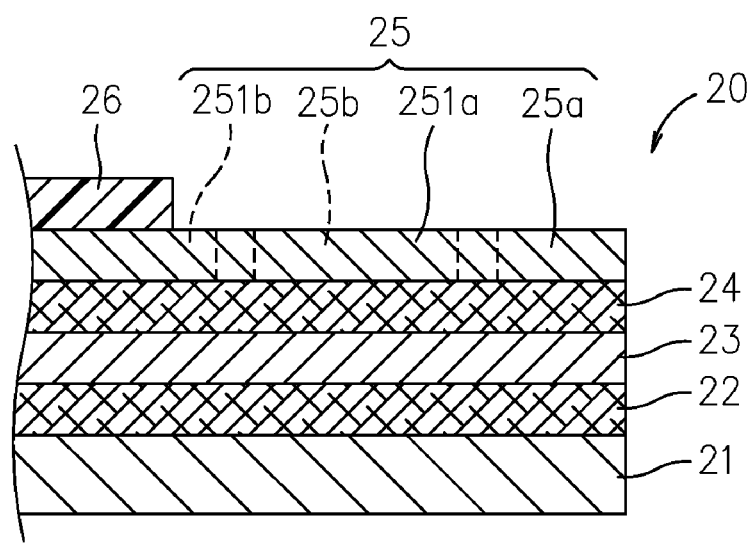
FIG. 4 is a B-B cross sectional view of FIG. 3.
Figure 5:
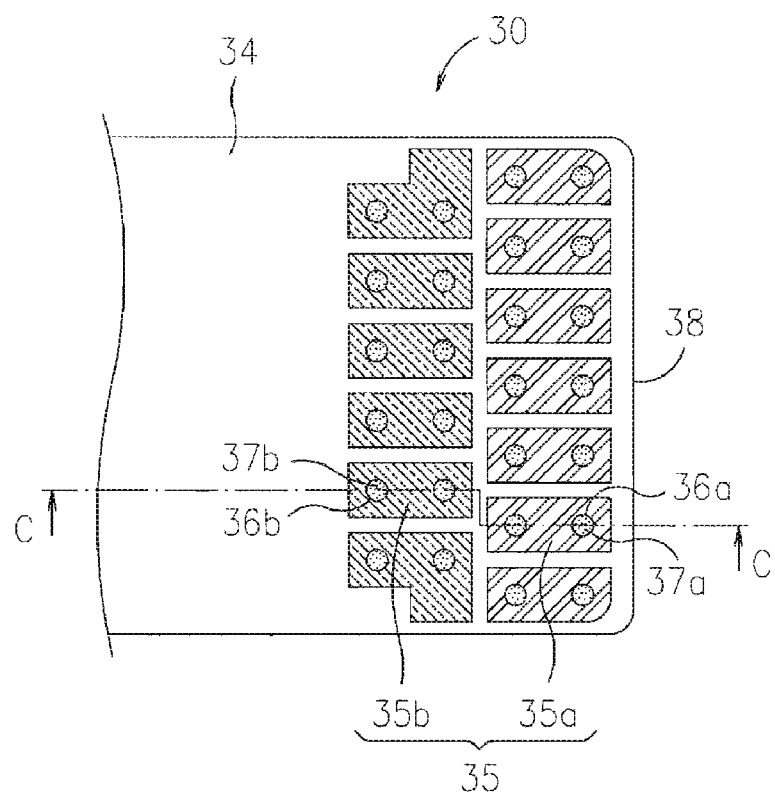
FIG. 5 is a schematic diagram showing a golden finger for FPC according to an embodiment of the invention.
Figure 6:
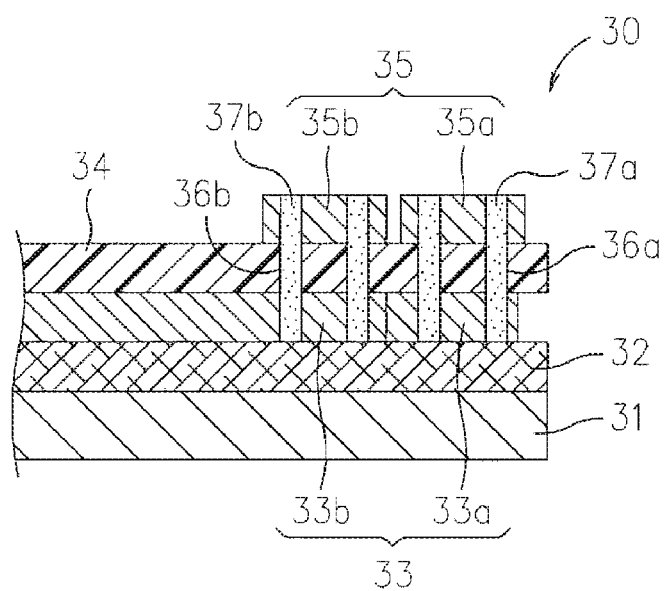
FIG. 6 is a C-C cross sectional view of FIG. 5.
Figure 7:
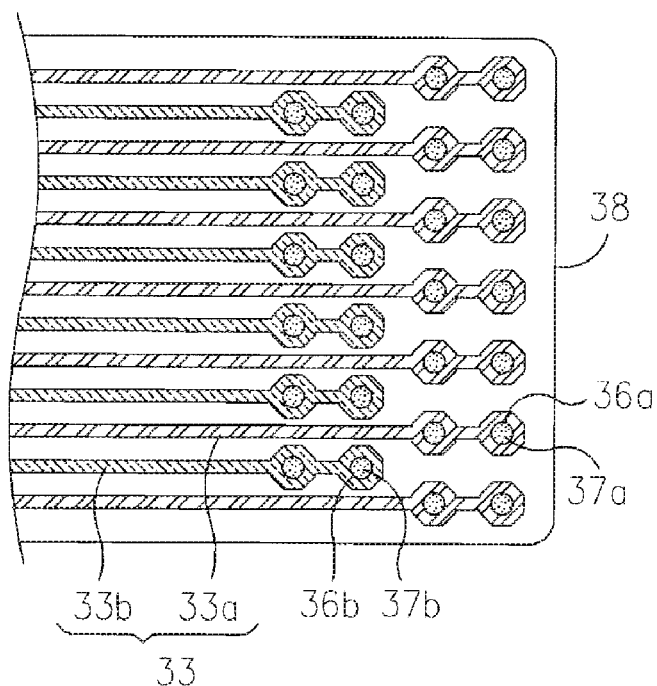
FIG. 7 is a schematic diagram showing how the routings in the golden finger of FIG. 5 are disposed on the bottom copper layer.

Please refer to FIG. 5 to FIG. 7, which show is a golden finger for FPC according to an embodiment of the invention. The golden finger, being a stacking structure with a tail 38 composed of a stiffening plate 31, a bottom substrate 32, a bottom copper layer 33, a cover layer 34, and a top copper layer 35 by arranging those from bottom to top in a stacking manner, has a plurality of first routings 33a and a plurality of second routings 33b formed on the bottom copper layer 33 while enabling the plural first routings 33a and the plural second routings 33b to be arranged in an alternating manner.

In addition, there are a plurality of first pins 35a and a plurality of second pins 35b formed on the top copper layer 35 in manner that the plural first pins 35a are arranged in a line while the plural second pins 35b are arranged in another line. Moreover, the amount of the first pins 35a is the same as that of the first routings 33a while enabling each first pin 35a to connect electrically with its corresponding first routing 33a by way of two corresponding first via holes 36a disposed therebetween as the two first via hole are filled with a conductive material 37a; and similarly the amount of the second pins is the same as that of the second routings while enabling each second pin to connect electrically with its corresponding second routing by way of two corresponding second via holes 36b disposed therebetween as the two first via hole are filled with another conductive material 37b.

It is noted that any of the conductive materials 37a, 37b filled in each of the first via holes 36a as well as the second via holes 36b can be a solder, or tube or column made of copper.

In this embodiment, the amount of the first pins 35a is not the same as that of the second pins 35b. Thereby, as the line of the first pins 35a is disposed side-by-side with the line of the second pins 35b while enabling the line of the first pins 35a to be positioned at a position closer to the tail 38 of the frame 30, the plural first pins 35a and the plural second pins 35b are arranged in a staggered conformation as each first pin 35a in the line is not aligned exactly with one second pins 35b selected from the plural second pins 35b in the line.

Figure 8:
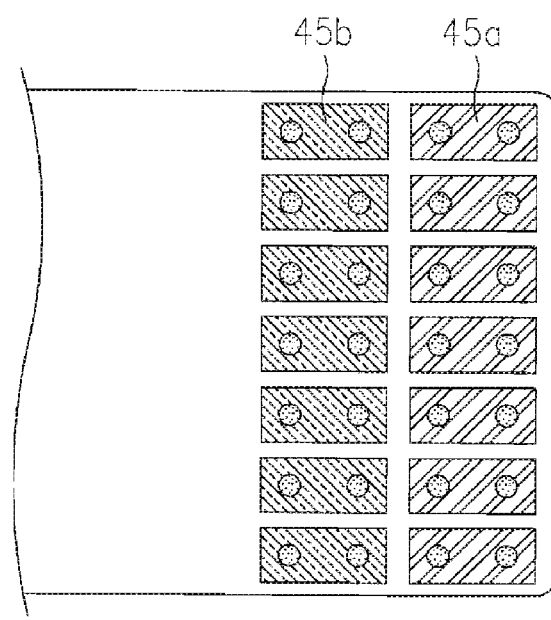
FIG. 8 shows a routing layout in a golden finger for FPC according to another embodiment of the invention.

Please refer to FIG. 8, which shows a routing layout in a golden finger for FPC according to another embodiment of the invention. In this embodiment, the amount of the first pins 45a is the same as that of the second pins 45b so that each first pin 45a in the line is aligned exactly with one corresponding second pins 45b selected from the plural second pins 45b in the line as the line of the first pins 45a is disposed side-by-side with the line of the second pins 45b. In addition, the routings corresponding to the first pins 45a and the second pins 45b are arranged at the bottom copper layer.

To sum up, the present invention provides a golden finger for flexible printed circuitboard (FPC), capable of enabling the golden finger to be manufactured with larger allowable manufacturing tolerance as the pins and routings of the golden finger are disposed on different layers of the same with comparatively larger line width, and thus capable of being manufactured with lower cost and higher yield while preventing the broken circuit in the golden finger from happening.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:
1. A golden finger for flexible printed circuitboard (FPC), being a stacking structure composed of a bottom substrate, a bottom copper layer, a cover layer, and a top copper layer by arranging those from bottom to top in a stacking manner, comprising:

at least one first routing, formed on the bottom copper layer;
    at least one second routing, formed on the bottom copper layer;
    at least one first pin, formed on the top copper layer and arranged in a first line;
    at least one second pin, formed on the top copper layer and arranged in a second line;
    at least one first via hole, each being disposed at a position between its corresponding first pin and first routing while having a conductive material disposed therein for enabling the first pin to connected with the first routing electrically; and
    at least one second via hole, each being disposed at a position between its corresponding second pin and second routing while having another conductive material disposed therein for enabling the second pin to connected with the second routing electrically,
    wherein the at least one first pin and the at least one second pin are arranged in a staggered conformation as each first pin in the first line is not aligned exactly with one second pin selected from the at least one second pin in the second line.

2. The golden finger of claim 1, wherein when there are a plurality of said first routings and a plurality of said second routings in the golden finger, the first routings and the second routings are arranged in an alternating manner.

3. The golden finger of claim 2, wherein the first line is disposed side-by-side with the second line while enabling the first line to be positioned at a position closer to the tail of the frame.

4. The golden finger of claim 1, wherein the amount of the first pins is not the same as that of the second pins.

5. The golden finger of claim 3, wherein at one of the plural first pin is arranged side-by-side with its corresponding second pin.

6. The golden finger of claim 5, wherein the amount of the first pins is the same as that of the second pins.

7. The golden finger of claim 2, wherein the amount of the first pins is the same as that of the first routings while enabling each first pin to connect electrically with its corresponding first routing; and the amount of the second pins is the same as that of the second routings while enabling each second pin to connect electrically with its corresponding second routing.

8. The golden finger of claim 1, wherein any of the conductive materials filled in each of the at least one first via hole as well as the second via hole is a solder.

9. The golden finger of claim 1, wherein any of the conductive materials filled in each of the at least one first via hole as well as the second via hole is a tube or column made of copper.

10. The golden finger of claim 1, wherein each of the at least one first via hole is formed penetrating the first pin, the cover layer and the corresponding first routing.

11. The golden finger of claim 9, wherein each of the at least one first via hole is formed penetrating the first pin, the cover layer and the corresponding first routing.

12. The golden finger of claim 1, wherein each of the at least one second via hole is formed penetrating the second pin, the cover layer and the corresponding second routing.

13. The golden finger of claim 9, wherein each of the at least one second via hole is formed penetrating the second pin, the cover layer and the corresponding second routing.

14. The golden finger of claim 1, wherein the stacking structure further comprises:
    a stiffening plate, formed under the bottom substrate.

\* \* \* \* \*